(12) United States Patent
Imada et al.

(10) Patent No.: US 7,534,359 B2
(45) Date of Patent: May 19, 2009

(54) PROCESS FOR PRODUCING STRUCTURE, STRUCTURE THEREOF, AND MAGNETIC RECORDING MEDIUM

(75) Inventors: Aya Imada, Yokohama (JP); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 326 days.

(21) Appl. No.: 10/559,966

(22) PCT Filed: Dec. 5, 2003

(86) PCT No.: PCT/JP03/15591

§ 371 (c)(1), (2), (4) Date: Dec. 8, 2005

(87) PCT Pub. No.: WO2004/109401

PCT Pub. Date: Dec. 16, 2004

(65) Prior Publication Data

US 2006/0144812 A1   Jul. 6, 2006

(30) Foreign Application Priority Data

Jun. 9, 2003   (JP) .............................. 2003-163852

(51) Int. Cl.
 *C25F 3/00* (2006.01)
(52) U.S. Cl. .............................. 216/11; 216/40; 216/44; 216/53; 216/83
(58) Field of Classification Search .................... 216/11, 216/40, 44, 53, 83
See application file for complete search history.

(56) References Cited

U.S. PATENT DOCUMENTS

| | | | |
|---|---|---|---|
| 5,772,905 A | 6/1998 | Chou | 216/44 |
| 6,309,580 B1 * | 10/2001 | Chou | 264/338 |
| 6,518,189 B1 | 2/2003 | Chou | 438/706 |
| 6,914,008 B2 | 7/2005 | Den et al. | 438/707 |
| 2003/0072971 A1 | 4/2003 | Fukutani et al. | 428/694.75 |
| 2006/0022342 A1 | 2/2006 | Fukutani et al. | 257/758 |
| 2006/0222903 A1 | 10/2006 | Ichihara et al. | 428/827 |

(Continued)

FOREIGN PATENT DOCUMENTS

JP   2000-232095   8/2000

(Continued)

OTHER PUBLICATIONS

Wikipedia, the free encyclopedia, Methyl methacrylate, http://en.wikipedia.org/wiki/Methyl_methacrylate, 2007.*

(Continued)

*Primary Examiner*—Binh X Tran
(74) *Attorney, Agent, or Firm*—Fitzpatrick, Cella, Harper & Scinto

(57) ABSTRACT

The present invention relates to a process for producing a structure having holes at prescribed positions. The structure is produced through steps of (A) providing an impressing member having protrusions, and a substrate, (B) forming a layer, on the substrate, from a material having a less strength than the impressing member, (C) forming depressions by impressing the impressing member on the layer corresponding to protrusions of the impressing member, (D) etching the layer to bare at least a part of the surface of the substrate, and (E) anodizing the substrate to form holes on the substrate.

5 Claims, 9 Drawing Sheets

U.S. PATENT DOCUMENTS

2006/0280862 A1  12/2006  Yasui et al. ................ 427/127

FOREIGN PATENT DOCUMENTS

| | | |
|---|---|---|
| JP | 2000-315785 | 11/2000 |
| JP | 2001-138300 | 5/2001 |
| JP | 2001-250217 | 9/2001 |
| JP | 2002-004087 | 1/2002 |
| JP | 2003-196815 | 7/2003 |
| WO | WO 00/00868 | 1/2000 |
| WO | WO 01/20402 | 3/2001 |
| WO | WO 02/07199 | 1/2002 |

OTHER PUBLICATIONS

Wikipedia, the free encyclopedia, Acrylic glass, http://en.wikipedia.org/wiki/Acrylic_glass ; 2007.*

* cited by examiner

PROCESS FOR PRODUCING STRUCTURE, STRUCTURE THEREOF, AND MAGNETIC RECORDING MEDIUM

CROSS-REFERENCE TO RELATED APPLICATION

This is the national stage for International Application PCT/JP2003/015591 under 35 U.S.C. §365.

TECHNICAL FIELD

The present invention relates to a process for producing a structure having holes, particularly to a process for producing a functional structure like a magnetic recording medium having holes filled with a functional material like a magnetic material.

BACKGROUND ART

A new technique, nano-imprinting, is disclosed for forming a nanometer-sized structure on a surface of an article by impressing directly a structure having protrusions on a working object, being different from conventional lithography utilizing a light beam or an electron beam (U.S. Pat. No. 5,772,905).

In this technique, as shown in FIGS. 9A to 9D, stamper 100 having a protrusion pattern 103 of a size of tens or hundreds of nanometers formed by an electron beam or the like is impressed on thin resin film 104 formed on flat substrate 105 and then detaching the stamper therefrom to form a projection-depression pattern: depression portion (molded region) 106 of the resin film is removed by reactive ion etching or a like method; and substrate 105 is etched by utilizing the unremoved remaining resin layer 107 as the mask to form structure 107, 108 having nano-metric projection-depressions corresponding to the original stamper. In this method, to prevent the deterioration of the stamper by impression operation, the impressing action is stopped before top face 141 of protrusion 103 of stamper 100 comes into direct contact with substrate 105 carrying thin resin film 104, and the stamper is detached. In this method, even if the impressing action is stopped before the protrusion top face of the stamper comes into direct contact with the substrate, the resin of the thin film can rise by the impression to come into contact with bottom face 142 of the depression portion of the stamper.

This contact may make irregular the formed protrusion-depression structure of the thin resin film on detaching of the stamper from the thin resin film.

The present invention intends to provide a structure having holes at desired positions.

DISCLOSURE OF THE INVENTION

According to an aspect of the present invention, there is provided a process for producing a structure having holes, comprising steps of (A) providing an impressing member having protrusions, and a substrate, (B) forming a layer, on the substrate, from a material having a less strength than the impressing member, (C) forming depressions by impressing the impressing member on the layer corresponding to protrusions of the impressing member, (D) etching the layer to bare at least a part of the surface of the substrate, and (E) anodizing the substrate to form holes on the substrate.

According to another aspect of the present invention, there is provided a process for producing a functional structure comprising a step of filling a functional material into the holes formed in the process.

In a structure of the present invention, the term "protrusion" and "protruded portion" means a portion protruded from the surround, i.e. depression defined in the following. The term "depression" and "depressed portion" means a portion comprised of a bottom having a level lower than that of a top of the adjacent protrusion. The term "protrusion-depression structure" means a structure consisting of the protrusion and the depression. When directing the attention to a pattern of protrusions of the protrusion-depression structure, the structure may be called as "protrusions structure", and when doing of depression, it may be as "depression structure". Patterns of these structures are called as "protrusion-depression structure pattern" or "protrusion-depression pattern" for short; "protrusion structure pattern" or "structure pattern" for short; and "depression structure pattern" or "depression pattern" for short, respectively. The distance between the top of a protrusion and the bottom of the adjacent depression is the "height of the protrusion" or the "depth of the depression".

The process for producing a structure of the present invention comprises the steps of forming a pattern by impressing an impressing member having a protrusin-depression structure consisting of plural protrusions and depressions on a patterning layer on a workable layer, and detaching the impressing member from the patterning layer. In this process, the top faces of the protrusions of the protrusion structure (hereinafter referred to as "protrusion top faces") has a size not larger than 500 nm and a height of not larger than 10 µm, the patterning layer is made thinner than the height of the protrusions of the impressing member to prevent the contact of the surface of the patterning layer with the depressed bottom of the protrusion-depression structure of the impressing member.

The above-mentioned size of the top face of the protrusion of the impressing member means a diameter for a circle-shaped face, and an outside diameter for polygon-shaped face. The height of the protrusion is in the range from several nanometers to 10 µm, preferably from tens of nanometers to 5 µm.

In a preferred process for producing a nano-structure of the present invention, patterning layer is formed on a workable layer in a thickness less than the height of the protrusion of the stamper, and the stamper is impressed on the opposing patterning layer to form in the patterning layer a depression pattern corresponding to the protrusion pattern of the stamper.

The patterning layer thinner than the height of the protrusions of the stamper reduces the adverse effects of air bubbles, rendering unnecessary a vacuum atmosphere. After the impressing operation, the workable layer is bared by etching, and bared portion is worked by anodization or like a treatment. Thus a simple nano-printing method is provided which does not require strict position control in the impressing direction.

BEST MODE FOR CARRYING OUT THE INVENTION

Preferred embodiments of the present invention are described below.

Figure 4A:
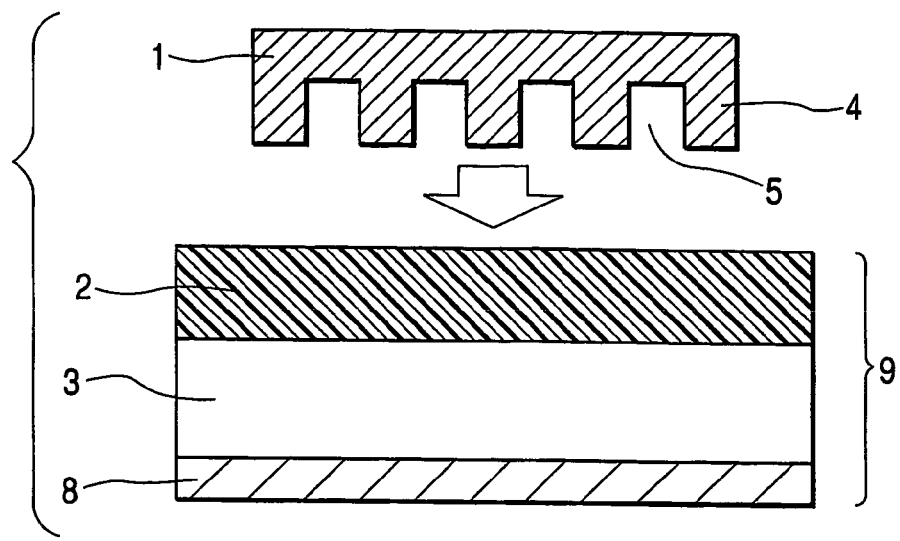
FIGS. 4A, 4B, and 4C are sectional views for explaining Example 4 of the present invention.
Figure 4B:
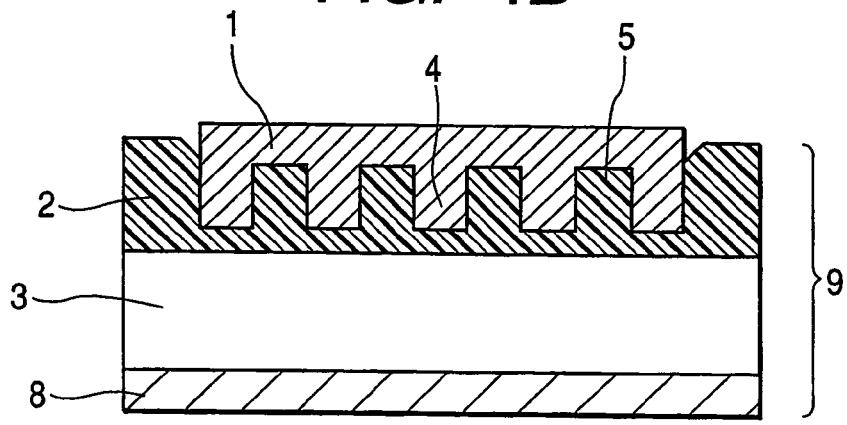
Figure 4C:
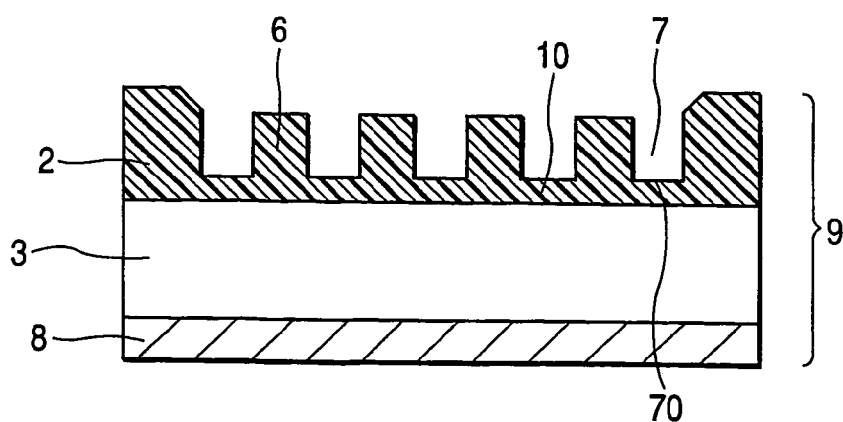

In a preferred embodiment of the present invention as shown in FIGS. 4A to 4C, a stamper (impressing member) having a protrusion pattern formed thereon is placed in opposition to a workable layer having a patterning layer provided thereon, and the stamper is impressed on the patterning layer such that at least the tops of the protrusions are brought as close as about 50 nm or less to the workable layer surface and is detached to form the protrusion pattern on the patterning layer, corresponding to the stamper.

In the case where the patterning layer is formed from a material which becomes less viscous in proportion to temperature elevation, preferably the stamper is impressed on the patterning layer heated to obtain suitable viscosity, and after cooling, the stamper is detached.

Figure 2A:
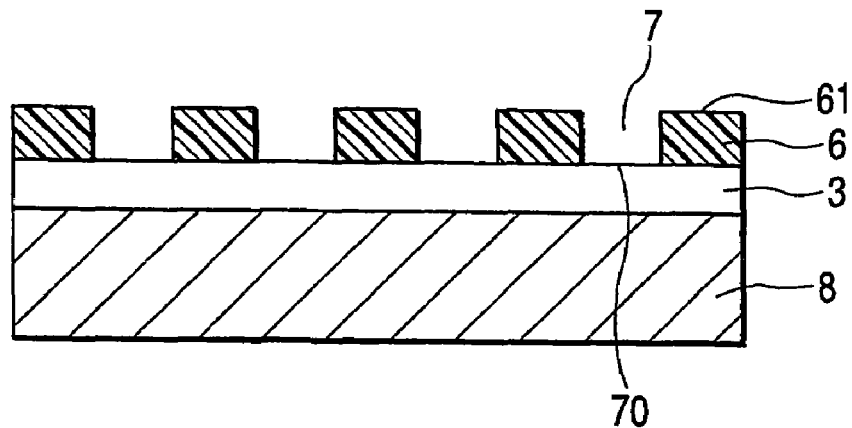
FIGS. 2A, 2B, and 2C are sectional views for explaining Examples 2 and 3 of the present invention.
Figure 2B:
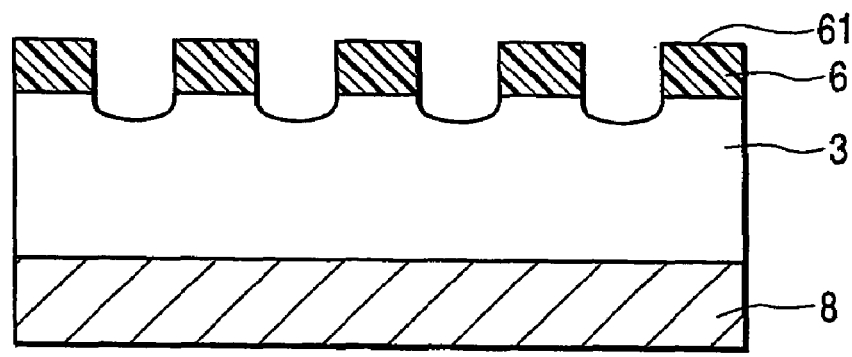
Figure 2C:
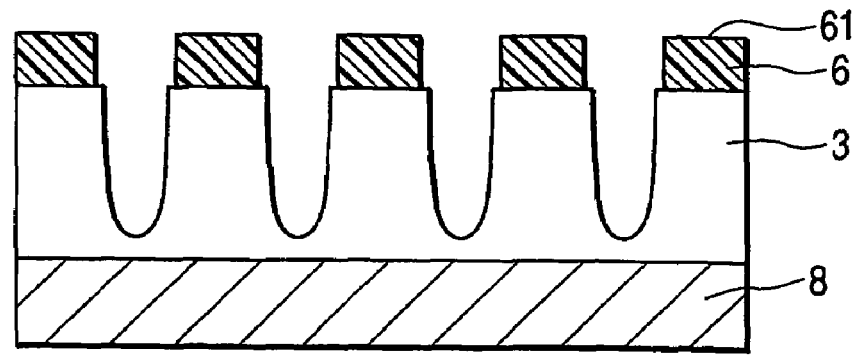

The nano-structure prepared as shown in FIGS. 2A and 2B is preferably dry-etched or wet-etched to bare the workable layer at the depressed portions of the patterning layer, and the nano-structure obtained above is preferably anodized to form a depression structure in the workable layer as shown in FIG. 2C.

In the step of baring the workable layer, the dry-etching or wet-etching is conducted preferably to bare the workable layer at the depressed portions of the patterning layer and to form depressions (holes) of depth of 1 nm or more in the workable layer (FIG. 2B).

The stamper has preferably at least one pair of protrusion-depression structures at intervals of not more than 1 μm between the protrusions.

The patterning layer is formed preferably from a flowable thin-coating material such as a resin solution in a solvent, a resin material containing an alkoxide or a silicone, and silsesquioxane.

The workable layer is composed preferably of a metal containing aluminum.

The workable layer is constituted preferably of an underlayer composed of a metal other than aluminum and a surface layer containing aluminum.

Figure 1A:
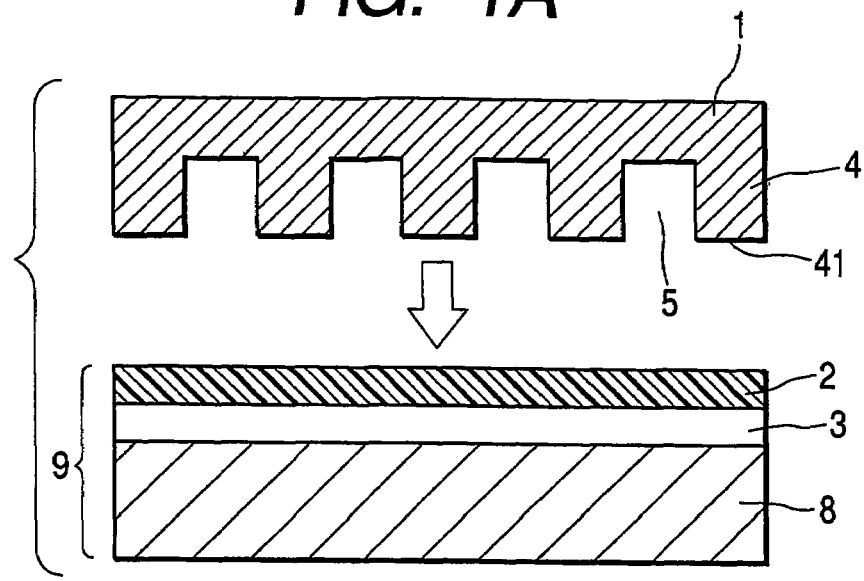
FIGS. 1A, 1B, and 1C are sectional views for explaining Example 1 of the present invention.
Figure 1B:
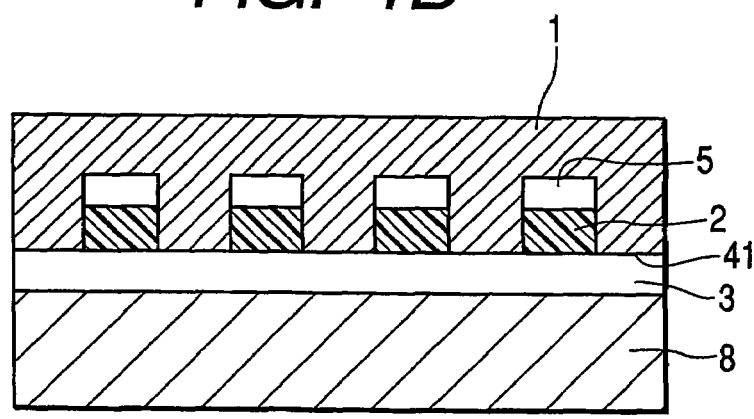
Figure 1C:
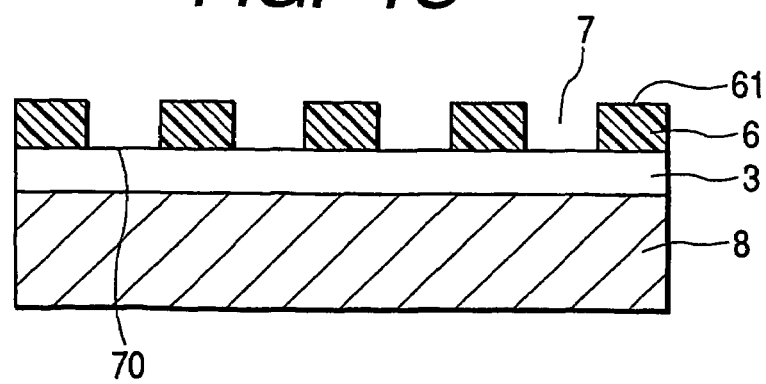

In a process of producing the nano-structure of the present invention, preferably as shown in FIGS. 1A to 1C, stamper 1 having a pattern of protrusions 4 is placed in opposition to workable layer 3 having patterning layer 2 of a thickness smaller than the height of protrusions 4 of the protrusion-depression structure; stamper 1 is impressed to bring the tops of protrusions 4 as close as 50 nm or less to the surface of workable layer 3; and the stamper is detached therefrom to form a protrusion pattern corresponding to stamper 1 on patterning layer 2.

Figure 5A:
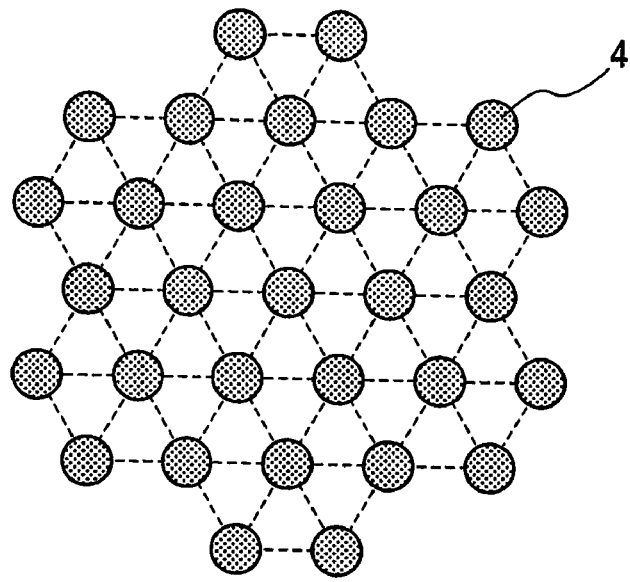
FIGS. 5A and 5B are surface views for explaining an example of arrangement of the depressed structure of the present invention.
Figure 5B:
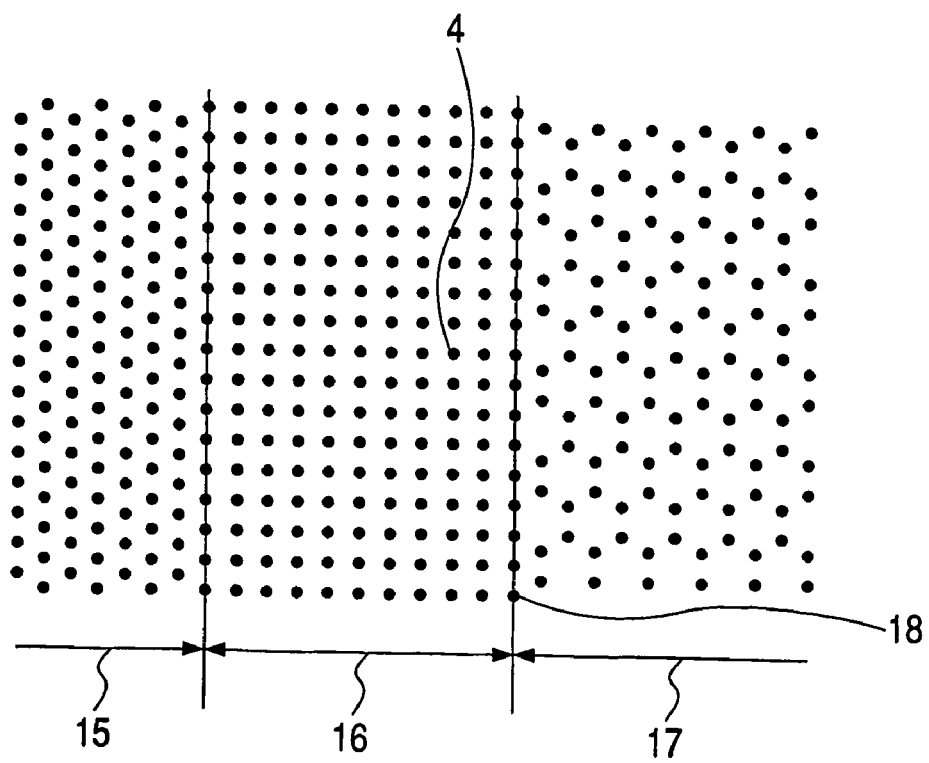

Stamper 1 having at least one protrusion or depression is formed by lithography employing an electron beam, an X-ray, ultraviolet light, visible light, or the like, wet-etching or dry-etching, electron beam direct-writing, anodic oxidation, and the like technique. The surface of protrusion 4 is preferably flat: plural protrusions have preferably the top faces placed on one and the same plane. The protrusion structure has preferably an arrangement of columns in a triangular lattice state as shown in FIG. 5A, or may have a multiple periodic arrangement constituted of several regular constitutions as shown in FIG. 5B. In the FIG. 5B, an arrow denoted by numeral 15 indicates a triangular lattice region, an arrow denoted by numeral 16 indicates a rectangular lattice region, and an arrow denoted by numeral 17 indicates a graphite lattice region. Dots 18 on boundary lines between the regions belong to both the regions.

In the production process of the present invention, preferably as shown in FIGS. 1A to 1C, patterning layer 2 is formed by applying a liquid material on workable layer 3 by spin coating or a like method: the liquid material being mainly composed of a flowable thin-coating material such as a resin solution in a solvent, a resin material containing an alkoxide or a silicone, and silsesquioxane. The thickness of patterning layer 2 is made smaller than the height of protrusion 4 of stamper 1. Then, stamper 1 is placed in opposition to patterning layer 2; the stamper is impressed to bring the tops of protrusions 4 as close as 50 nm or less to the surface of workable layer 3; and the stamper is detached therefrom to form a depression pattern corresponding to protrusion pattern 4 in stamper 1 on patterning layer 2. The impressing member is preferably a regularly arranged protrusion structure having a surface layer composed of silicon, nickel, or the like, and is preferably coated with a releasing material such as a fluororesin, and a silane coupling agent for improving releasability.

The smaller thickness of patterning layer 2 than the height of protrusions 4 of the stamper reduces the adverse effect of an air bubble imprisoned in depression portion 5 of the stamper to impede the pattern formation. This makes unnecessary a vacuum atmosphere for the impressing and detaching operation. The working object 9 to be worked is preferably heated to a temperature necessary for obtaining a lower viscosity of patterning layer 2 before the impression operation.

The structure produced as above is subjected preferably to dry-etching or wet-etching to remove patterning layer 2 remaining at bottoms 70 of depression portions 7 of the patterning layer to bare workable layer 3 (FIGS. 2A and 2B).

For example, in the case where workable layer 3 is composed of an electroconductive material such as a metal and patterning layer 2 is composed of an insulating material such as a resin, electroplating can be conducted by utilizing protrusions 6 of patterning layer 2 after pattern formation as a mask and the bared portions of workable layer 3 as an electrode. Thereafter by immersion into a solution capable of dissolving selectively patterning layer 2, a structure can be obtained which has a protrusion-depression structure corresponding to that of stamper 1 from a different material.

Figure 6A:
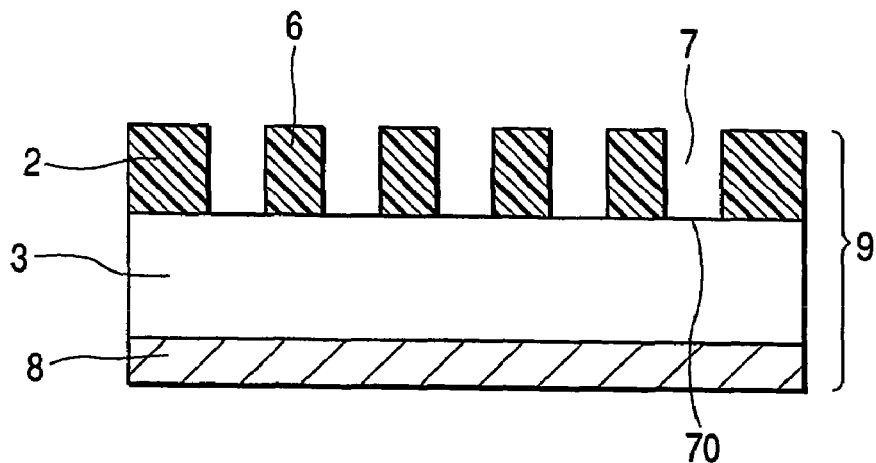
FIGS. 6A, 6B, and 6C are sectional views for explaining Example 5 of the present invention.
Figure 6B:
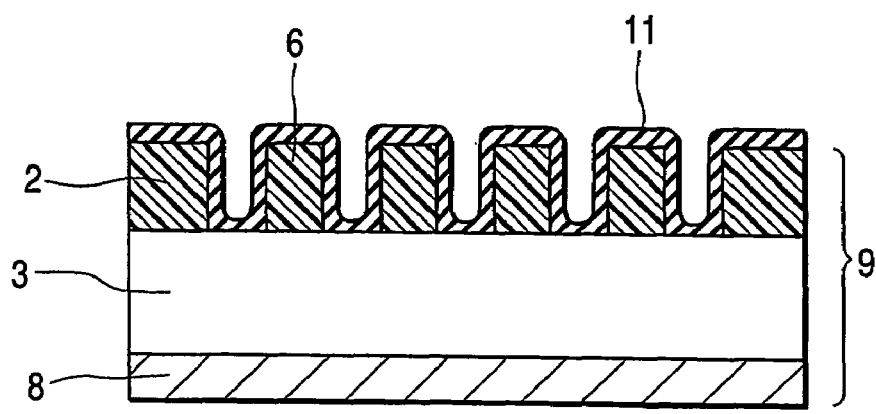
Figure 6C:
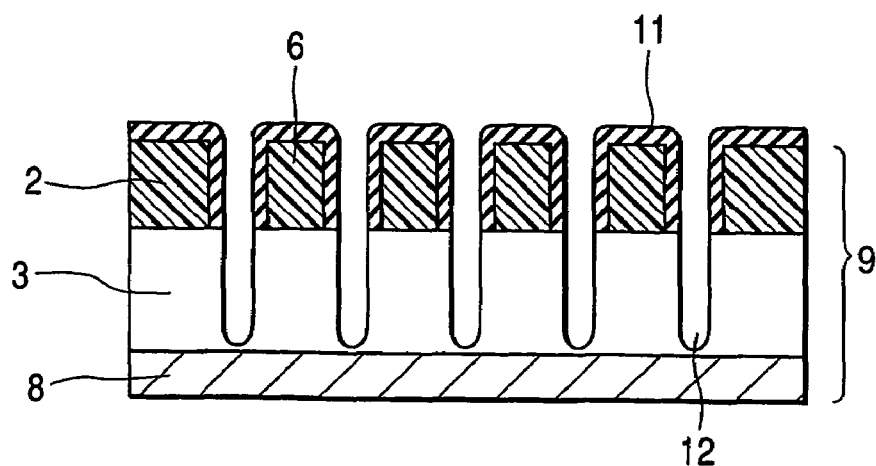

In the case where workable layer 3 is made from a material mainly composed of aluminum, alumina nano-holes can be obtained by anodization starting from the bared portions of the etched workable layer obtained by etching the remaining film at bottom 70 of depression 7 of the patterning layer. If the patterning layer is soluble in the anodization solution, the layer is protected by lamination of thin protection layer 11 made of a metal like aluminum (FIG. 6B) which can be dissolved during the anodization, and then the anodization is conducted (FIG. 6C) as shown in FIGS. 6A to 6C.

Figure 7A:
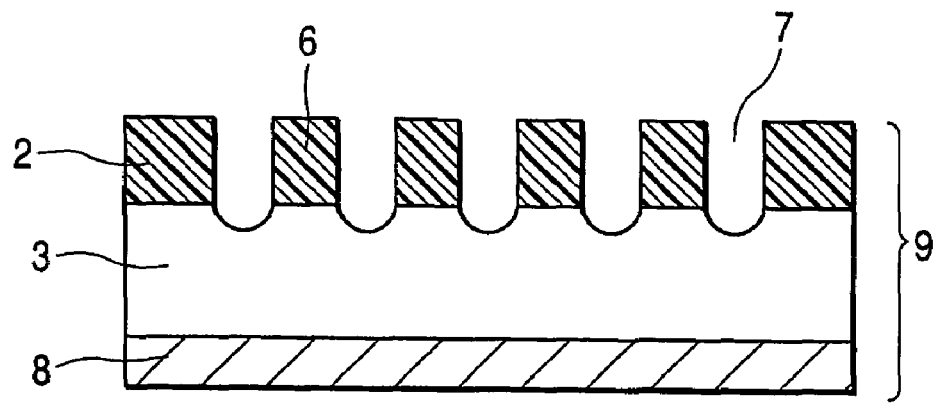
FIGS. 7A, 7B, and 7C are sectional views for explaining Example 6 of the present invention.
Figure 7B:
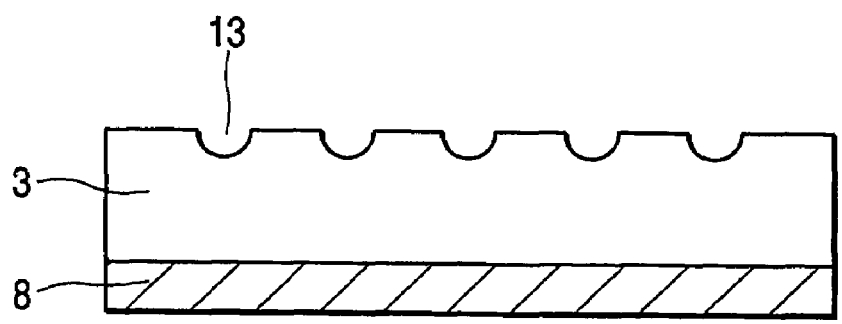
Figure 7C:
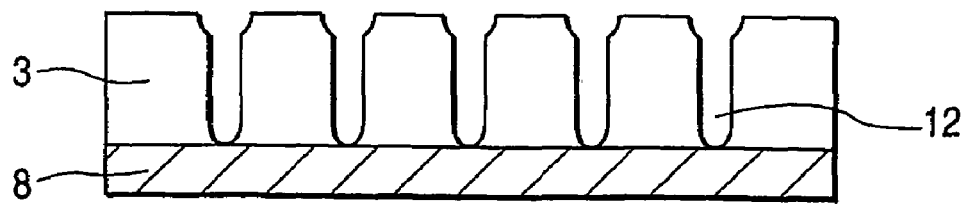

In the case where the bared portions of the workable layer are also etched more or less during the etching treatment as shown in FIGS. 7A to 7C, the patterning layer is removed (FIG. 7B) and then the anodization is conducted (FIG. 7C).

The anodization is conducted specifically by application of a voltage by utilizing the workable layer having the patterning layer as the anode in an acidic solution such as an aqueous oxalic acid solution and an aqueous sulfuric solution. The oxidation and dissolution by the anodization is initiated predominantly from the depression portions of the patterning layer to form fine holes arranged in the depression pattern. The voltage to be applied is considered generally to be equal to the arrangement cycle multiplied by a factor of $2.5^{-1}$ [V/nm]. For example, for a triangular lattice arrangement of 100 nm intervals, a voltage of 40 volts is applied. The average cycle length of the formed fine holes depends on the applied voltage. Accordingly, in formation of regular triangular depression pattern on patterning layer 2 and subsequent formation of the fine holes on bottoms 70 of depressions 7, slight disturbance of regular arrangement of the depression structure can be corrected automatically into regular arrangement of the fine holes by action of the applied anodization voltage.

In the case where the patterning layer is made of a material which is dissolvable at a suitable dissolving rate uniformly by the anodization solution, the etching process may be omitted. With start of the anodization, the patterning layer begins to dissolve to bare the workable layer at bottoms 70 of the depressions. Then electric current comes to flow through the bared layer portions to form nano-holes on the workable layer. When the patterning layer is made of a material which is not soluble in the anodic oxidation solution, no change occurs on the workable layer surface.

The diameter of the formed nano-holes can be enlarged as desired by immersion in a solution capable of dissolving the workable layer, such as an aqueous phosphoric acid solution.

Various functional structure can be produced by filling the holes with a functional material by electrodepositing, sputtering, or a like method. In particular, a magnetic recording medium can be obtained by filling the fine holes with a magnetic material by electrodeposition.

EXAMPLE

The present invention is described below in detail by reference to drawings.

Example 1

An example of the present invention is described below by reference to FIGS. 1A to 1C.

Stamper 1 having protrusion-depression pattern formed thereon is impressed to opposing workable layer 3 having patterning layer 2 having a thickness less than the height of protrusions 4. After the tops of the protrusions 4 has reached the position 30 nm to the surface of workable layer 3, the stamper is detached, thereby forming a protrusion pattern of stamper 1 on patterning layer 2.

For example, columnar protrusions 4 having a diameter of 30 nm and a height of 75 nm are formed at arrangement intervals of 100 nm on a base plate by electron beam projection and dry-etching to prepare stamper 1. Separately, on Si substrate 8, there are formed workable layer 3 composed of silicon oxide ($SiO_2$) in a thickness of 100 nm and patterning layer 2 composed of polymethyl methacrylate (PMMA) in a thickness of 50 nm. This PMMA layer is formed by applying a solution thereof in ethyl cellosolve acetate solution by spin coating. Stamper 1 is placed in opposition to patterning layer 2, and impressed thereon at a substrate temperature of 120° C. with an impression load of 1000 kgf/cm². After impression for 30 seconds and cooling to 60° C., the stamper is detached (FIGS. 1A and 1B). The height of the protrusion 6 (non-impressed portion) of patterning layer 2 is increased slightly by the flow of resin corresponding to the volume of formed depressions 7 by the impression, and the resin remains in a thin film state on the bottom 70 of depression 7 owing to nonuniformity of the stamper shape.

The thickness of patterning layer 2 is smaller than the height of stamper protrusion 4. Therefore, the air bubble, which is usually imprisoned in depression portion 5 of the stamper and impedes the pattern formation, is allowed to escape through the depression space of the stamper to the outside. Therefore, the fine pattern can be formed without vacuum application by the impression operation. The required impression pressure is less because of the smaller contact area. Further, since the height of protrusion 6 (non-impressed portion) of the patterning layer after pattern formation depends on the initial film thickness of patterning layer 2 and the shape of stamper 1, fine adjustment of the impression load and position control of the impression direction are not necessary.

Example 2

An example of the present invention is described below by reference to FIGS. 2A to 2C and FIG. 3.

The structure having been prepared by the process for production of a nano-structure in Example 1 is subjected to dry-etching or wet-etching to remove the remaining resin material from bottoms 70 of depressions 7 of the patterning layer to bare workable layer 3.

Stamper 1 described in Example 1 is placed in opposition to working object 9 having workable layer 3 composed of aluminum (Al) of 100 nm thick and having patterning layer 2 composed of PMMA. Stamper 1 is impressed thereon at a substrate temperature of 120° C. at a load of 1000 kgf/cm² for a holding time of 30 seconds, and after cooling to 60° C., the stamper is detached to obtain a structure shown in FIG. 1C. The structure is subjected to dry-etching in an oxygen atmosphere to remove the resin remaining at bottoms 70 of depressions 7 of the patterning layer to bare Al (FIG. 2A). Otherwise, the etching may be conducted in an atmosphere of a mixture of $BCl_3$ and $O_2$ to remove simultaneously the Al below bottom 70 of depression 7 of the patterning layer to form hollows (FIG. 2B).

Thereafter, tin-copper solder electroplating is conducted by utilizing protrusion portion 6 of the patterning layer as the mask and workable layer 3 as the electrode, and then protrusion 6 of the patterning layer is selectively removed by ultrasonic acetone washing to obtain a solder-protrusion structure having protrusions in an nanometeric intervals.

Figure 3A:
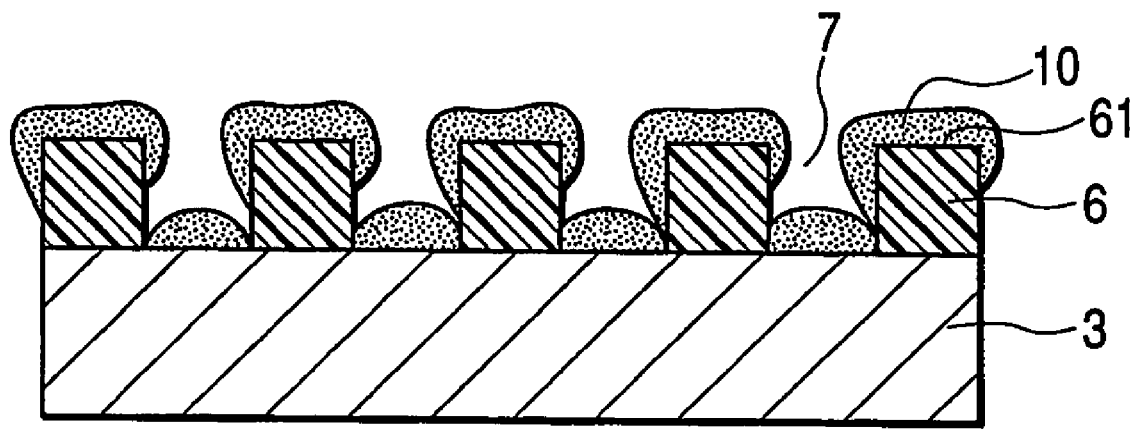
FIGS. 3A and 3B are sectional views for explaining Examples 2 and 3 of the present invention.
Figure 3B:
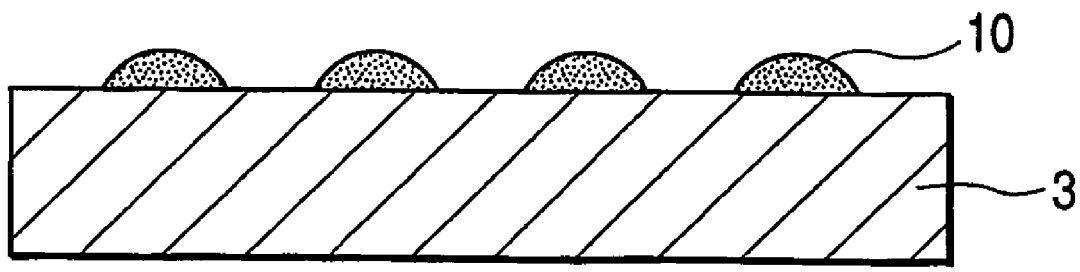

Otherwise, lamination film 10 is formed from a desired material by sputtering or a like method as shown in FIG. 3A, and protrusion 6 of the patterning layer is selectively removed by ultrasonic acetone washing to obtain protrusion structure shown in FIG. 3B.

Example 3

An example of the present invention is described below by reference to FIGS. 2A to 2C and FIGS. 3A and 3B.

Stamper 1 described in Example 1 is placed in opposition to working object 9 having workable layer 3 composed of Al and having patterning layer 2 composed of silsesquioxane. Stamper 1 is impressed thereon with the substrate kept at room temperature with a load of 1200 kgf/cm² for a holding time of 30 seconds. Then the stamper is detached. The worked object is dry-etched in an atmosphere of argon and $SF_6$ to bare Al (FIG. 2A). The dry-etched object is subjected to anodization by utilizing the Al as the anode in an aqueous 0.3 mol/L oxalic acid solution at a temperature of 16° C. by application of a voltage of 40V. Since the anodization is initiated at the bared portion, nanometer-sized holes are obtained which have a high aspect ratio and are arranged in a pattern of the patterning layer (FIG. 2C). The silsesquioxane, which is insoluble in an aqueous oxalic acid solution, need not be removed.

Example 4

An example of the present invention is described below by reference to FIGS. 4A to 4C.

Stamper 1 having a protrusion-depression pattern formed thereon is impressed on workable layer 3 having patterning layer 2 thereon, and then detached. Thereby, a depression pattern which is counter to the protrusion pattern of stamper 1 is formed in patterning layer 2.

As an example, from an Si base plate, stamper 1 is prepared by forming columnar protrusions 4 of 30 nm diameter and 75 nm high in a triangular lattice arrangement at intervals of 100 nm by electron beam lithography and dry-etching. The top faces of the highest protrusions 4 are positioned preferably on one and the same plane. Separately, on substrate 8, there are formed workable layer 3 of 100 nm thick composed or silicon oxide ($SiO_2$) and patterning layer 2 of 100 nm thick composed of polymethyl methacrylate (PMMA) as shown in FIGS. 4A to 4C. The PMMA is applied as a solution in ethyl cellosolve acetate by spin coating. Stamper 1 is placed in opposition to patterning layer 2, and is impressed thereon at a substrate temperature of 120° C. at a load of 500 kgf/cm$^2$. The stamper and the substrate are cooled at that state to 60° C., and then the stamper is detached (FIGS. 4A, 4B, and 4C). The resin in a volume corresponding to the volume of depression 7 is allowed to flow, whereby the thickness around the impressed portions of patterning layer 2 increases slightly in comparison with that before the impression. At the bottoms 70 of depressions 7, the resin remains in a thin film owing to nonuniformity of the stamper shape and incomplete flow of the resin.

An air bubble may be imprisoned in depression 5 of stamper 1 depending on the shape of the pattern. This imprisoned air can impede the flow of the resin, and makes difficult the formation of the pattern in precise accordance with the stamper shape. This adverse effect can be reduced by raising the substrate temperature to increase the flowability of the resin, decreasing the thickness of patterning layer 2 to be less than that of protrusion 4, or other counter measures.

Example 5

An example of the present invention is described below by reference to FIGS. 6A to 6C.

The structure obtained by the process of production of a nano-structure in Example 4 is subjected to dry-etching or wet-etching to remove the resin remaining on bottoms 70 of depressions 7 of the patterning layer to bare workable layer 3.

Stamper 1 described in Example 4 is placed in opposition to working object 9 constituted of Si substrate 8, and workable layer 3 composed of aluminum (Al) of 200 nm thick and patterning layer 2 composed of PMMA formed on the substrate. Stamper 1 is impressed thereon at a substrate temperature of 120° C. at a load of 500 kgf/cm$^2$, and is detached after cooling to 60° C. to obtain a structure shown in FIG. 4C. This structure is subjected to dry-etching in an oxygen atmosphere to remove selectively the resin remaining at bottoms 70 of depressions 7 of the patterning layer to bare Al (FIG. 6A). Then as shown in FIG. 6B, protection layer 11 is formed from Al in a thickness of 5 nm by sputtering. Anodization is conducted by utilizing this layer as the anode in an aqueous oxalic solution (0.3 mol/L, 16° C.) by application of 40 V. Thereby alumina nano-holes are formed as shown in FIG. 6C. The nano-holes are formed from bottoms 70 of depressions 7 of the patterning layer in a triangular lattice arrangement at intervals of 100 nm. Protection layer 11 serves to protect patterning layer 2 from corrosion in the acidic solution, and can be removed later by ultrasonic washing in a solution capable of dissolving aluminum such as an aqueous phosphoric acid solution. The PMMA can also be removed by ultrasonic washing in a solvent such as an aqueous phosphoric solution, and acetone.

Example 6

An example of the present invention is described below by reference to FIGS. 7A to 7C.

In the preparation of the nano-structure described in Example 5 or Example 2, both the resin remaining at bottoms of depressions 7 of the patterning layer and Al can be simultaneously removed by etching in an mixed etching atmosphere containing $BCl_3$ and $O_2$ to form hollows on the Al surface (FIG. 7A). Thereafter, the PMMA is removed by ultrasonic acetone washing or ozone-ashing (FIG. 7B). This working object as the anode is subjected to anodization in an aqueous oxalic acid solution (0.3 mol/L, 16° C.) by voltage application of 40 V to form alumina nano-holes as shown in FIG. 7C. The nano-holes are formed starting from hollows 13 on the surface of the Al, and are arranged in triangular lattice at intervals of 100 nm.

Example 7

Figure 8A:
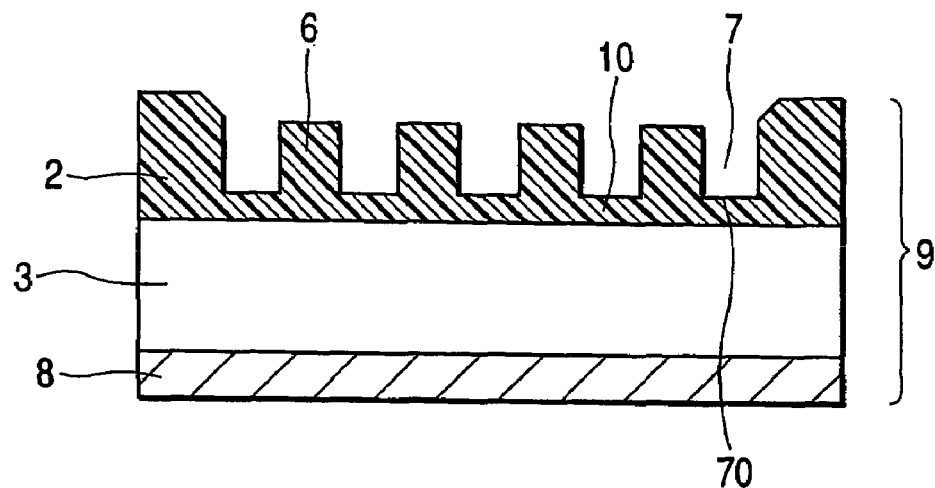
FIGS. 8A, 8B, and 8C are sectional views for explaining Example 7 of the present invention.
Figure 8B:
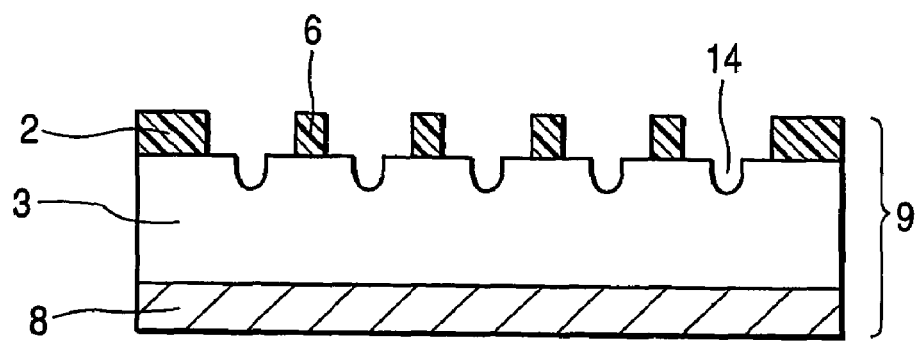
Figure 8C:
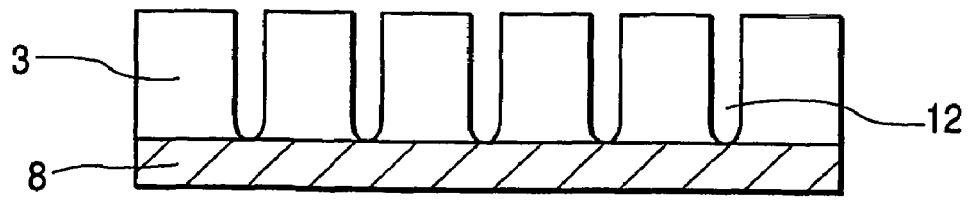
Figure 9A:
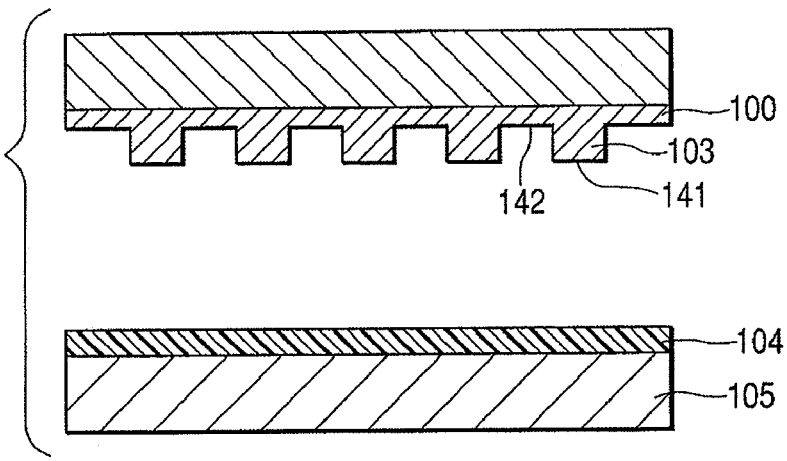
FIGS. 9A, 9B, 9C, and 9D are sectional views for explaining an example of prior art.
Figure 9B:
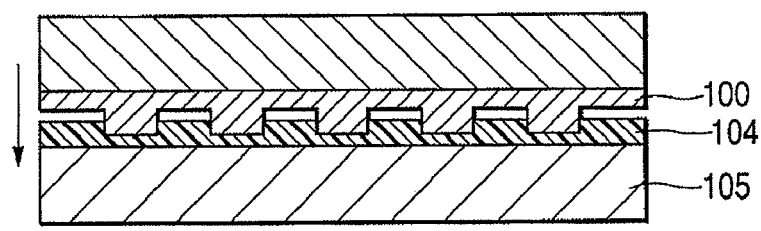
Figure 9C:
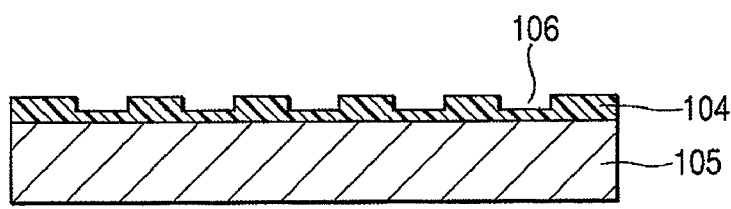
Figure 9D:
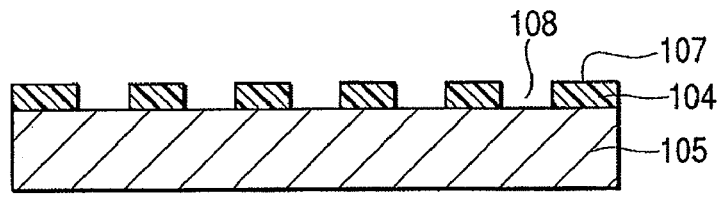

An example of the present invention is described below by reference to FIGS. 8A to 8C.

A stamper having a protrusion-depression pattern is placed in opposition to a workable layer having a patterning layer, and is impressed thereon and detached therefrom to form, on the patterning layer, a depression pattern corresponding to the protrusion pattern of the stamper.

Next, on a substrate composed of Si, a titanium film is formed in a thickness of 10 nm, and further thereon an aluminum film is formed in a thickness of 500 nm as a workable layer. Further thereon, a patterning layer is formed from aluminum alkoxide in a thickness of 75 nm. The aluminum alkoxide is applied as an IPA (isopropyl alcohol) solution by spin coating. The stamper employed in Example 4 is placed in opposition to the patterning layer, and impressed thereon at a substrate temperature of 150° C. with a load of 1000 kgf/cm$^2$. The stamper and the object are cooled to 60° C. by keeping the impressing state. Thereafter the stamper is detached. The patterning layer becomes slightly thicker around the impressed points after the impression corresponding to the volume of the flow of the resin caused by the impression. The resin remains at the bottom portions of the depression in a thin film owing to nonuniformity of the stamper shape and incomplete flow of the resin.

This working object as the anode is subjected to anodic oxidation in an aqueous oxalic acid solution (0.3 mol/L, 16° C.) by application of a voltage of 40 V. In this operation, the aluminum alkoxide is gradually hydrolyzed and dissolved in the aqueous oxalic acid solution. Therefore, the electric current begins to flow firstly at the depression bottoms where the workable layer is bared, which initiates formation of the alumina nano-holes. The alumina nano-holes are formed by the anodization perpendicularly to the substrate and can readily be obtained in a high aspect ratio, which cannot be attained by usual photolithography or etching.

After immersion in an aqueous phosphoric acid solution (0.3 mol/L) for 40 minutes, regular alumina nano-holes are obtained which have a diameter of 30 nm and a depth of 500 nm.

Finally, a magnetic recording medium is obtained by filling the holes with a magnetic material by electrodeposition.

The present invention provides a process for producing a nano-structure by a nano-imprinting in combination with dry-etching, wet-etching, or anodic oxidation, enabling simple production of depression type structure.

The invention claimed is:

1. A process for producing a structure having holes, comprising the steps of:
   providing a first member having a patterning layer comprised of an aluminum alkoxide;
   forming a protrusion-depression structure on the patterning layer by impressing a second member having protrusions on the patterning layer, wherein the depression of the protrusion-depression structure contains a residual film of the aluminum alkoxide; and
   anodizing a substrate by immersing the substrate in an anodization solution, retaining the patterning layer in the depression of the protrusion-depression structure, to form holes on the substrate, starting from the depression side, wherein the residual film is removed during anodization without conducting an etching step.

2. The process according to claim 1, wherein the patterning layer of aluminum alkoxide has less strength than the second member.

3. The process according to claim 1, wherein the height of the protrusions of the second member is larger than the thickness of the patterning layer.

4. A process for producing a functional structure comprising a step of filling a functional material into the holes formed in the process set forth in claim 1.

5. A process for producing a magnetic recording medium, wherein the functional material set forth in claim 4 is a magnetic material.

* * * * *